United States Patent
Nair et al.

(10) Patent No.: US 6,664,834 B2
(45) Date of Patent: Dec. 16, 2003

(54) METHOD FOR AUTOMATIC DUTY CYCLE CONTROL USING ADAPTIVE BODY BIAS CONTROL

(75) Inventors: Rajendran Nair, Gilbert, AZ (US); Chantal E. Wright, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 88 days.

(21) Appl. No.: 09/746,211

(22) Filed: Dec. 22, 2000

(65) Prior Publication Data

US 2002/0079939 A1 Jun. 27, 2002

(51) Int. Cl.[7] ............................................. H03K 3/017
(52) U.S. Cl. ...................................... 327/175; 327/170
(58) Field of Search ................................. 327/175, 170, 327/173, 174, 35, 37

(56) References Cited

U.S. PATENT DOCUMENTS

| | | | | |
|---|---|---|---|---|
| 5,477,180 A | * | 12/1995 | Chen | 327/108 |
| 5,572,158 A | * | 11/1996 | Lee et al. | 327/165 |
| 5,808,498 A | * | 9/1998 | Donnelly et al. | 327/155 |
| 5,907,254 A | * | 5/1999 | Chang | 327/165 |
| 6,084,452 A | * | 7/2000 | Drost et al. | 327/165 |
| 6,198,322 B1 | * | 3/2001 | Yoshimura | 327/153 |
| 6,320,438 B1 | * | 11/2001 | Arcus | 327/165 |
| 6,366,115 B1 | * | 4/2002 | DiTommaso | 326/26 |

* cited by examiner

*Primary Examiner*—Timothy P. Callahan
*Assistant Examiner*—Cassandra Cox
(74) *Attorney, Agent, or Firm*—Blakely, Sokoloff, Taylor & Zafman LLP

(57) ABSTRACT

A method including sensing a duty cycle, measuring the variation of the duty cycle from a desired duty cycle, and differentially adjusting the rising and falling edges of the duty cycle is disclosed.

35 Claims, 5 Drawing Sheets

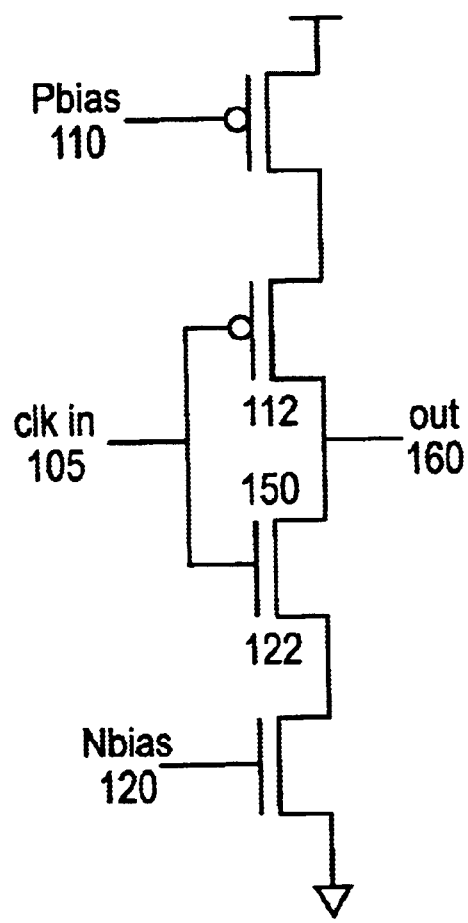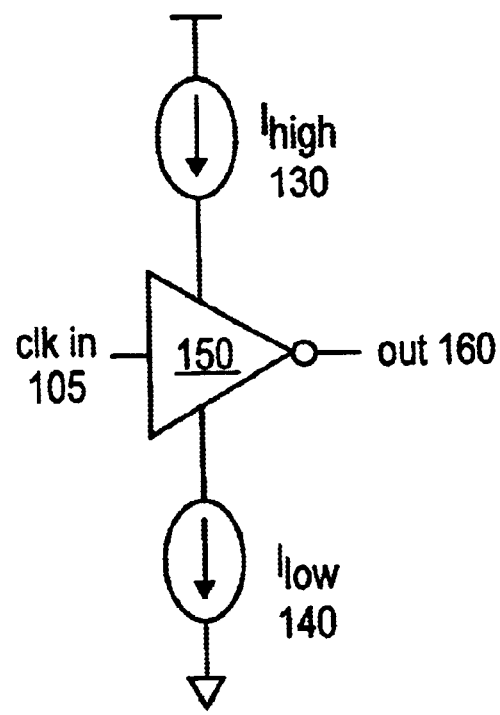
FIG. 1A
(PRIOR ART)
FIG. 1B
(PRIOR ART)

METHOD FOR AUTOMATIC DUTY CYCLE CONTROL USING ADAPTIVE BODY BIAS CONTROL

FIELD OF INVENTION

The invention is related to the field of integrated circuits.

BACKGROUND OF THE INVENTION

The duty cycle of a clock signal is the ratio of the "on" time to the total time period of the clock cycle. Integrated circuits, such as microprocessors, rely on clock generators to provide a clock signal. The clock generator can include a phase locked loop (PLL) device and an oscillator. The PLL receives an external frequency signal from the oscillator and locks onto the external frequency. The PLL can then send the frequency to divider circuits to divide the frequency of the signal to a desired duty cycle, such as 50% for example. The duty cycle can then be distributed throughout the integrated circuit. However, the duty cycle may travel through a number of buffers, which may distort the duty cycle.

For example, clock distribution circuits typically use inverters or buffers to drive the clock signal. While a PLL controls the frequency and typically also the duty cycle, the duty cycle may become distorted due to variations between the P and N devices of the distribution inverters. If buffers are used, this distortion will be reduced as the signal passes through two stages, but clock skew will be increased by the additional delay. Furthermore, to moderate the duty cycle, the PLL must generate a clock two times the frequency of that required by the circuit.

One approach that has been implemented to address these problems is shown in FIGS. 1A and 1B, which show a current-starved inverter in schematic and functional form. In this approach, devices 110 and 120 are connected in series to serve as controlled current sources 130 and 140 for inverter 150, which includes devices 112 and 122. By controlling the current sources 130 and 140, the output slew of output clock signal 160 can be adjusted to maintain the duty cycle of input clock signal 105. However, as processes scale and Vcc decreases, the headroom used by the series devices 110 and 120 significantly decreases the range of control allowed by this approach. Additionally, there is some non-linearity at the ends of the control range in this circuit.

BRIEF DESCRIPTION OF THE DRAWINGS

The present invention is illustrated by way of example and not limitation in the figures of the accompanying drawings, in which like references indicate similar elements, and in which:

FIGS. 1A and 1B show prior art current sources for an inverter.

DETAILED DESCRIPTION

A method for automatic duty cycle control using adaptive body bias is disclosed. In one embodiment, the method includes sensing a duty cycle, measuring the variation of the duty cycle from a desired duty cycle, and differentially adjusting the rising and falling edges of the duty cycle. The method enables a duty cycle to be maintained at a desired value through adaptive body bias control.

At higher frequencies, the waveform of the duty cycle is a trapezoid. The rising and falling edges of the duty cycle may be a significant portion of the duty cycle, such as 20% for example. A distorted duty cycle may be corrected by differentially adjusting the duration of the rising and falling edges. For example, given a duty cycle having a symmetric trapezoidal waveform, if the duration of the rising edge is shortened, and the duration of the falling edge is lengthened, the duration of the "on" time for the duty cycle is extended. Similarly, if the duration of the rising edge is lengthened, and the duration of the falling edge is shortened, the duration of the "on" time for the duty cycle is shortened. Thus, by differentially adjusting the slew of the rising and falling edges, the duty cycle can be controlled.

A method to provide automatic duty cycle control using adaptive body bias can automatically correct the duty cycle at a fanout inverter through adaptive body biasing control. The method can maintain a desired duty cycle, such as a 50% duty cycle for example, without sacrificing headroom or linearity. In fact, the control range of the method may increase as Vcc shrinks.

Figure 2:
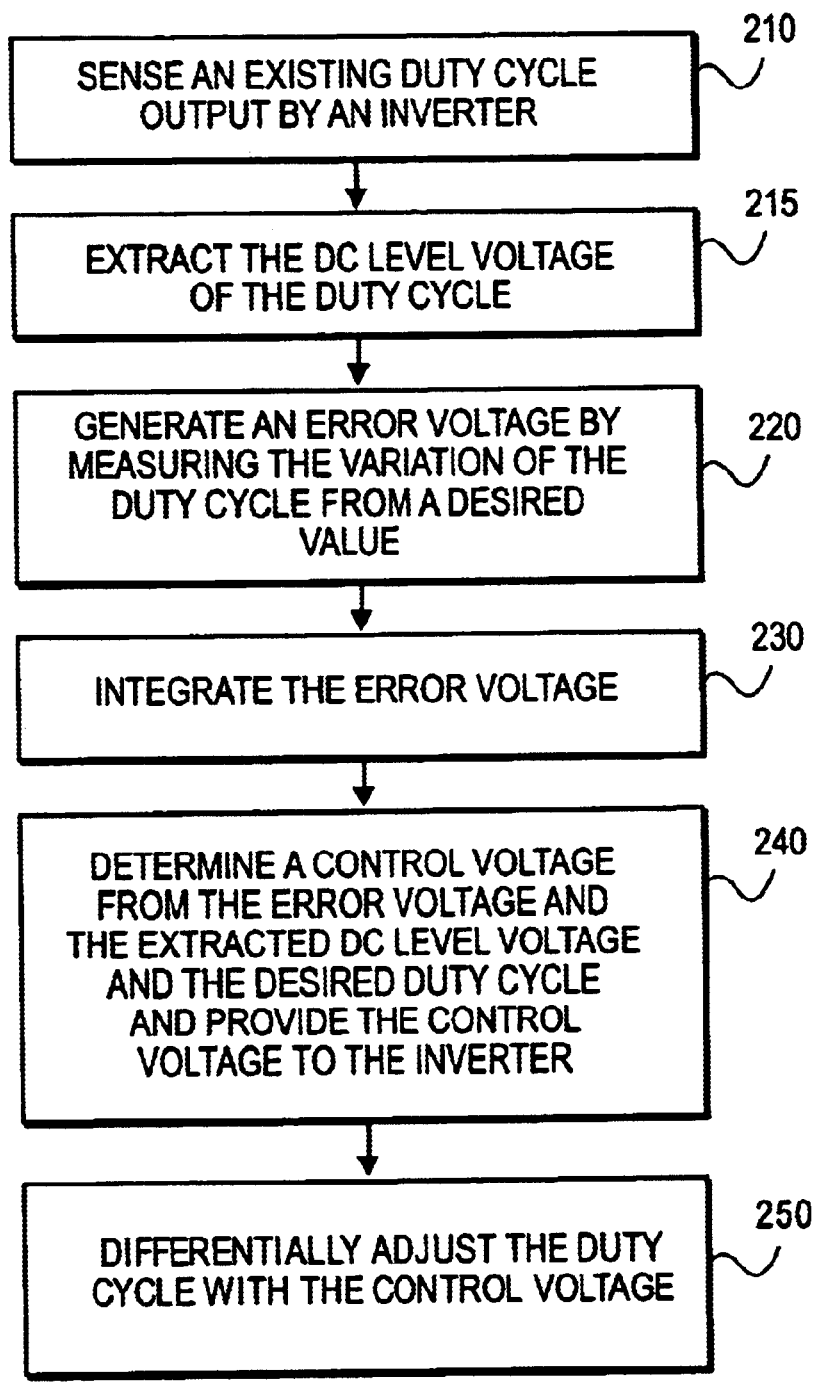
FIG. 2 shows an example of a method of providing automatic duty cycle control using adaptive body bias.

FIG. 2 shows an example of one embodiment of a method to provide automatic duty cycle control using adaptive body bias. The existing duty cycle from the output of an inverter is sensed, 210, and a direct current (DC) level voltage of the duty cycle is extracted, 215. The variation of the duty cycle from the desired value of the duty cycle is measured, 220, to generate an error voltage. The error voltage may be integrated, 230, to improve the control of the duty cycle. The error voltage and the extracted DC voltage are added and multiplied by a duty cycle factor to provide a control voltage to the inverter, 240. The control voltage differentially adjusts the slew of the rising and falling edges of the output of the inverter to control the duty cycle, 250.

The rising and falling edges can be differentially adjusted by adaptively adjusting the body bias of the inverter. For example, if the "on" period of the duty cycle is longer than the desired value of the duty cycle, the control voltage causes the inverter to lengthen the rising edge of the duty cycle, and to shorten the falling edge of the duty cycle, thus reducing the duty cycle until the duty cycle reaches the desired value. If the inverter includes a p-Field Effect Transistor (p-FET) device and an n-FET device, the control voltage can apply a reverse body bias to the p-FET device to cause the p-FET device to turn on slower, thus lengthening the rising edge of the duty cycle. Similarly, the control voltage can apply a forward body bias to the n-FET device to turn off the p-FET device quicker, thus shortening the falling edge of the duty cycle. The control voltage may also adaptively adjust the body bias of the transistor components of the inverters to lengthen the duty cycle if the "on" time is below the desired value, by applying a forward body bias to the p-FET device and by applying a reverse body bias to the n-FET device.

Figure 3:
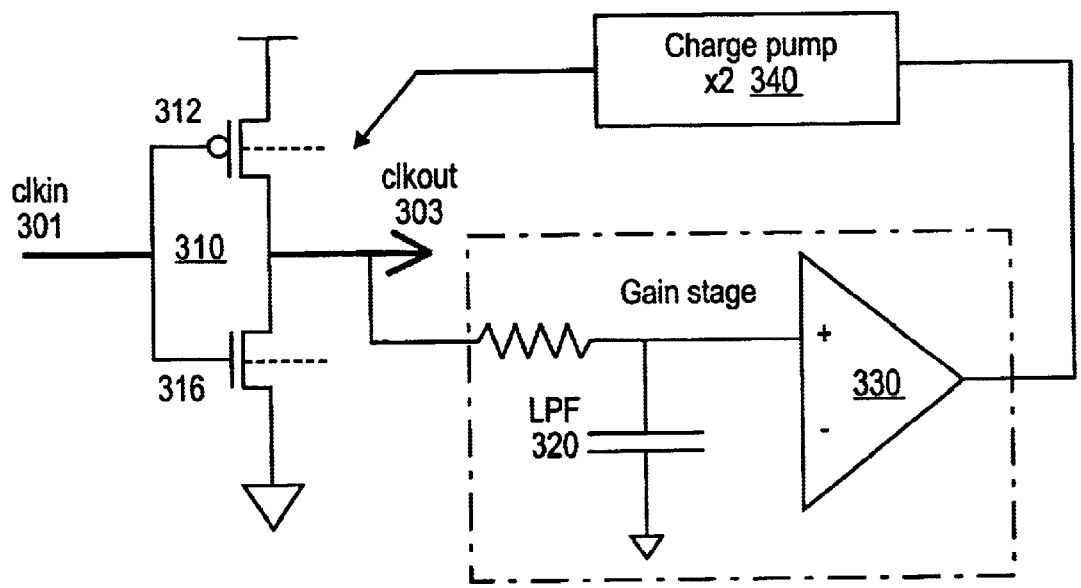
FIG. 3 shows an example of an adaptive body biased inverter.

An example of one embodiment of an adaptive body biased inverter that controls the duty cycle using adaptive body bias is shown in FIG. 3. The adaptive body biased inverter includes an inverter 310 that receives an input clock signal 301 and outputs clock signal 303. Inverter 310 includes p-FET device 312 and n-FET device 316. Low pass filter (LPF) 320 monitors the duty cycle of clock signal 303 by extracting the DC component of the duty cycle and outputs an error voltage. Amplifier 330 amplifies the error voltage. Charge pump 340 multiplies the error voltage by a desired value to generate the control voltage for the body bias. The control voltage may be applied to p-FET device 312 to adjust the body bias of p-FET device 312, thus controlling the rising edge of the duty cycle. The control voltage may be applied to n-FET device 316 to adjust the body bias of n-FET device 316, thus controlling the falling edge of the duty cycle.

For example, as shown in FIG. 3, the p-FET transistor body bias, which is normally tied to Vcc, can be adjusted. When the bias voltage of the p-FET device is increased, the source and drain diode junctions are reversed biased which effectively raises the threshold voltage Vt, slowing the device. If the bias is decreased, the diodes are forward biased which lowers Vt and results in a faster device. This property can be utilized to react to duty cycle distortions and maintain a desired duty cycle, such as 50% for example, of output clock signal 303.

Figure 4:
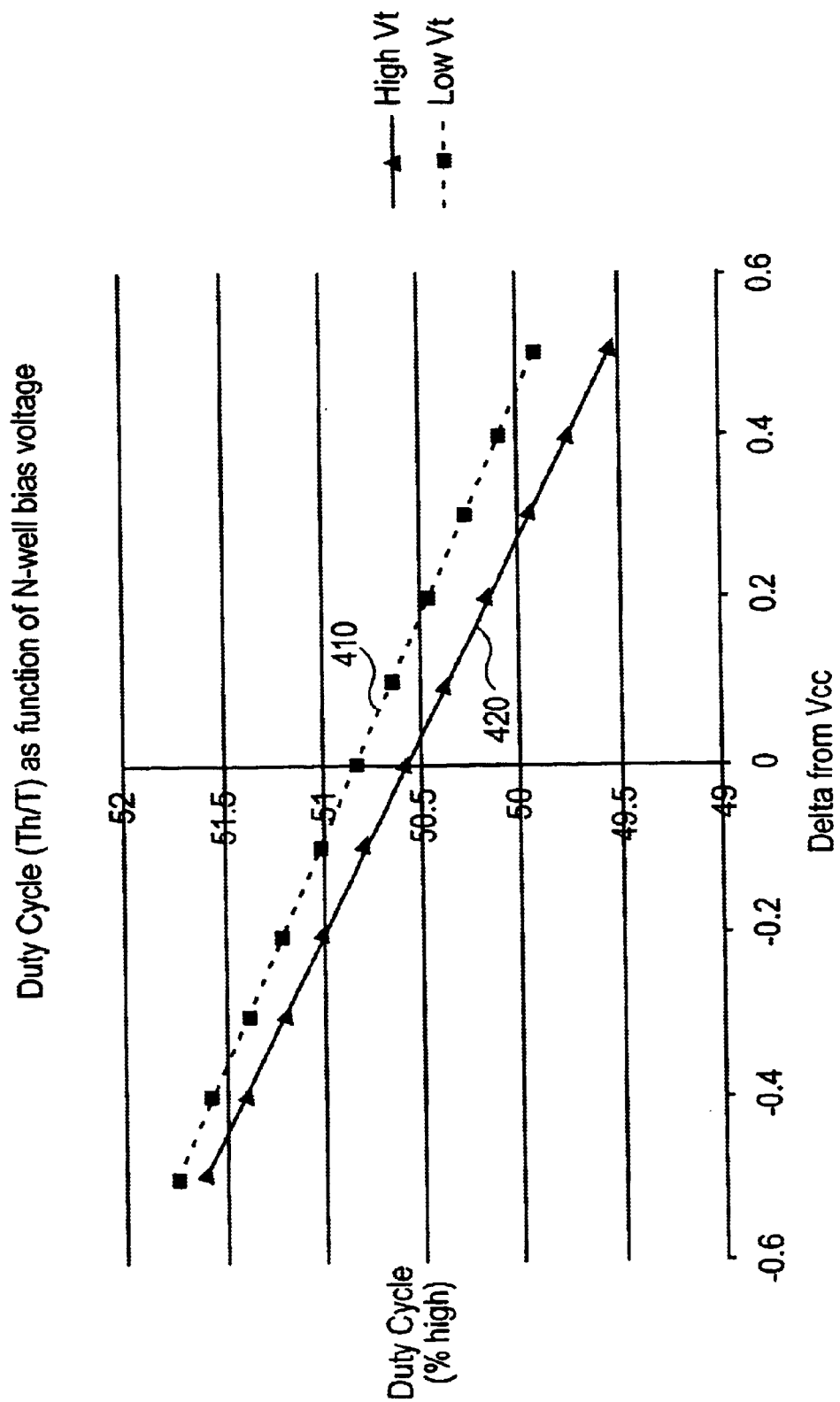
FIG. 4 shows an example of the performance of the method of providing automatic duty cycle control.

An example of the performance of the method to provide automatic duty cycle control using adaptive body bias is shown in FIG. 4. In this example, an adaptive body biased inverter was simulated with 0.1 u technology. As the N-well body bias voltage varies +/−500 milli-volts (mV) about Vcc, a linear duty cycle adjustment is observed. The low threshold voltage transistors exhibit a duty-cycle variation curve 410 that is not as steep as high threshold voltage curve 420. As processes scale and the Vcc/Vt ratio degrades, the control range of this method improves.

Figure 5:
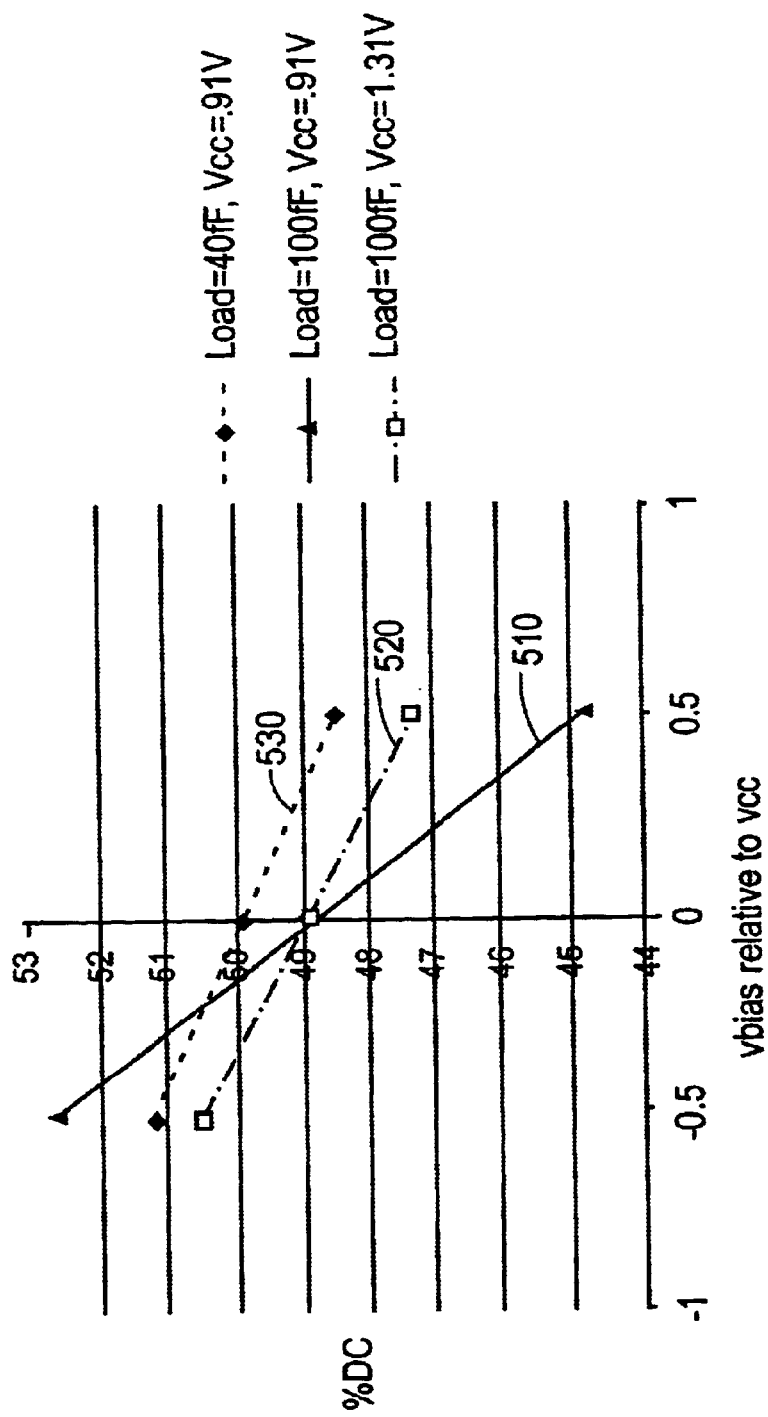
FIG. 5 shows another example of the performance of the method of providing automatic duty cycle control.

Another example of the performance of the method to provide automatic duty cycle control is shown in FIG. 5. In this example, the simulation was performed at 5 GHz, with 60 pico-second (ps) driven edges. The output edges were measured at about 40 ps with an optimal load. As shown in FIG. 5, slowing the edge by increasing the load results in a greater range of control for this method. Decreasing Vcc also results in a greater range of control. Line 510 shows the performance where Vcc is 0.91 volts (V), and the load is 100 femto Farads (fF). Line 520 shows the performance where Vcc is 1.3 V and the load is 100 fF. Line 530 shows the performance where Vcc is 0.91 V and the load is 40 fF.

The method and apparatus provide automatic duty cycle correction. Also, the method and apparatus provide duty cycle correction that is linear over range of control voltages. Also, the control range of the method increases as processes scale. The apparatus may find application in clock distribution in high performance microprocessors and accompanying high speed components.

In complementary metal oxide semiconductor (CMOS) technology, the N transistors share the bulk silicon as a common body terminal while the P transistors have isolated wells which can be individually biased. In Silicon on Insulator (SOI) technology, both types of well are accessible, and the method and apparatus may therefore be applied to both terminals to provide duty cycle control.

Continual process and voltage scaling in CMOS design introduces significant challenges in the design of clock generation and distribution circuits. Reducing supply voltage values, required because of reliability and power issues in finer dimension processes make the implementation of traditional techniques for accurate clock generation and distribution difficult. Increasing frequencies of operation make the task of designing all the more difficult by squeezing the allowed uncertainty margins. The method and apparatus described herein ensure performance at higher frequencies and lower voltages that come about with process scaling. The method and apparatus enable circuits and architecture that can maintaining a 50% duty cycle through adaptive body bias control.

These and other embodiments of the present invention may be realized in accordance with these teachings and it should be evident that various modifications and changes may be made in these teachings without departing from the broader spirit and scope of the invention. The specification and drawings are, accordingly, to be regarded in an illustrative rather than restrictive sense and the invention measured only in terms of the claims.

What is claimed is:

1. A method comprising:
    seeing a signal having a duty cycle, output from an inverter;
    measuring the variation of the duty cycle from a desired duty cycle;
    differentially adjusting the rising and falling edges of the duty cycle; and
    adaptively adjusting first body bias of a p-FET transistor of an inverter with the control voltage.

2. The method of claim 1, wherein measuring further comprises:
    generating a control voltage.

3. The method of claim 2, wherein differentially adjusting further comprises:
    adaptively adjusting second body bias of an n-FET transistor of the inverter with the control voltage.

4. The method of claim 3, wherein the first body bias is a forward body bias, and the second body bias is a reverse body bias.

5. The method of claim 3, wherein the first body bias is a reverse body bias and the second body bias is a forward body bias.

6. An apparatus comprising:
    means for sensing a duty cycle, output from an inverter;
    means for measuring he variation of the duty cycle from a desired duty cycle;
    means for differential y adjusting the rising and falling edges of the duty cycle; and
    means for adaptively adjusting a first body bias of a p-FET transistor of an inverter with the control voltage.

7. The apparatus of claim 6, wherein said means for measuring further comprises:
    means for generating a control voltage.

8. The apparatus of claim 7, wherein said means for differentially adjusting further comprises:
    means for adaptively adjusting a second body bias of an n-FET transistor of the inverter with the control voltage.

9. The apparatus of claim 7, wherein the first body bias is a forward body bias, and the second body bias is a reverse body bias.

10. The apparatus of claim 7, wherein the first body bias is a reverse body bias and the second body bias is a forward body bias.

11. An apparatus comprising:
    an inverter to output a signal having a duty cycle
    a low pass filter to measure a variation of the duty cycle from a desired duty cycle; and
    a charge pump to differentially adjust the rising and falling edges of the duty cycle.

12. The apparatus of claim 11, wherein the charge pump generates a control voltage to differentially adjust the rising and falling edges of the duty cycle.

13. The apparatus of claim 12, wherein the charge pump differentially adjusts by
   adaptively adjusting a first body bias of a p-FET transistor of the inverter with the control voltage; and
   adaptively adjusting a second body bias of an n-FET transistor of the inverter with the control voltage.

14. The apparatus of claim 13, wherein the first body bias is a forward body bias, and the second body bias is a reverse body bias.

15. The apparatus of claim 13, wherein the first body bias is a reverse body bias and the second body bias is a forward body bias.

16. An apparatus comprising:
   a unit to sense a duty cycle output from an inverter;
   a unit to measure a v nation of the duty cycle from a selected duty cycle;
   a unit to differentially adjust the rising and falling edges of the duty cycle; and
   a unit to adaptively a just a first body bias of a p-FET transistor of an inverter with the control voltage.

17. The apparatus of claim 16, wherein the unit to measure is further to generate a control voltage.

18. The apparatus of claim 17, wherein the unit to differentially adjust is further to adaptively adjust a second body bias of an n-FET transistor of the inverter with the control voltage.

19. The apparatus of claim 17, wherein the first body bias is a forward body bias, and the second b dy bias is a reverse body bias.

20. The apparatus of claim 17, wherein the first body bias is a reverse body bias and the second body bias is a forward body bias.

21. An apparatus comprising:
   a unit to sense a duty cycle output from an inverter;
   a unit to measure a v nation of the duty cycle from a selected duty cycle;
   a unit to differentially adjust the rising and falling edges of the duty cycle; and
   a unit to adaptively a just a first body bias of an n-FET transistor of an inverter with the control voltage.

22. The apparatus of claim 21, wherein the unit to measure is further to generate a control voltage.

23. The apparatus of claim 22, wherein the unit to differentially adjust is further to adaptively adjust a second body bias of a p-FET transistor of the inverter with the control voltage.

24. The apparatus of claim 22, wherein the first body bias is a forward body bias, and the second body bias is a reverse body bias.

25. The apparatus of claim 22, wherein the first body bias is a reverse body bias and the second body bias is a forward body bias.

26. An apparatus comprising:
   means for sensing a duty cycle, output from an inverter;
   means for measuring the variation of the duty cycle from a desired duty cycle;
   means for differentially adjusting the rising and falling edges of the duty cycle; and
   means for adaptively adjusting a first body bias of an n-FET transistor of an inverter with the control voltage.

27. The apparatus of claim 26, wherein said means for measuring further comprises:
   means for generating a control voltage.

28. The apparatus of claim 27, wherein said means for differentially adjusting further comprises:
   means for adaptively adjusting a second body bias of a p-FET transistor of the inverter with the control voltage.

29. The apparatus of claim 27, wherein the first body bias is a forward body bias, and the second body bias is a reverse body bias.

30. The apparatus of claim 27, wherein the first body bias is a reverse body bias and the second body bias is a forward body bias.

31. A method comprising:
   sensing a signal having a duty cycle, output from an inverter;
   measuring the variation of the duty cycle from a desired duty cycle;
   differentially adjusting the rising and falling edges of the duty cycle; and
   adaptively adjusting first body bias of an n-FET transistor of an inverter with the control voltage.

32. The method of claim 31, wherein measuring further comprises:
   generating a control voltage.

33. The method of claim 32, wherein differentially adjusting further comprises:
   adaptively adjusting second body bias of a p-FET transistor of the inverter with the control voltage.

34. The method of claim 33, wherein the first body bias is a forward body bias, and the second body bias is a reverse body bias.

35. The method of claim 33, wherein the first body bias is a reverse body bias and the second body bias is a forward body bias.

* * * * *

UNITED STATES PATENT AND TRADEMARK OFFICE
CERTIFICATE OF CORRECTION

PATENT NO. : 6,664,834 B2
DATED : December 16, 2003
INVENTOR(S) : Nair et al.

It is certified that error appears in the above-identified patent and that said Letters Patent is hereby corrected as shown below:

Column 4,
Line 38, delete "he" and insert -- the --.
Line 40, delete "differential y" and insert -- differentially --.

Column 1,
Lines 15 and 36, delete "v nation" and insert -- variation --.
Lines 20 and 41, delete "a just" and insert -- adjust --.
Line 29, delete "b dy" and insert -- body --.

Signed and Sealed this

Sixteenth Day of March, 2004

JON W. DUDAS
*Acting Director of the United States Patent and Trademark Office*